(12) United States Patent
Farooq et al.

(10) Patent No.: US 7,939,369 B2
(45) Date of Patent: May 10, 2011

(54) 3D INTEGRATION STRUCTURE AND METHOD USING BONDED METAL PLANES

(75) Inventors: Mukta G. Farooq, Hopewell Junction, NY (US); Subramanian S. Iyer, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 12/465,839

(22) Filed: May 14, 2009

(65) Prior Publication Data

US 2010/0289144 A1 Nov. 18, 2010

(51) Int. Cl.
*H01L 21/44* (2006.01)
*H01L 21/48* (2006.01)
*H01L 21/50* (2006.01)

(52) U.S. Cl. . 438/107; 257/686; 257/725; 257/E21.614; 257/E23.027; 257/E23.085; 438/106; 438/109

(58) Field of Classification Search .......... 257/686, 257/725, E23.085, E23.027, E21.614; 438/106, 438/107, 109
See application file for complete search history.

(56) References Cited

U.S. PATENT DOCUMENTS

| | | | |
|---|---|---|---|
| 4,285,969 A | 8/1981 | Galli et al. | |
| 5,753,536 A * | 5/1998 | Sugiyama et al. | 438/108 |
| 6,413,798 B2 * | 7/2002 | Asada | 438/108 |
| 6,577,013 B1 | 6/2003 | Glenn et al. | |
| 6,809,421 B1 | 10/2004 | Hayasaka et al. | |
| 6,824,888 B2 | 11/2004 | Hatano et al. | |
| 7,056,813 B2 | 6/2006 | Morrow et al. | |
| 7,307,003 B2 | 12/2007 | Reif et al. | |
| 7,312,487 B2 | 12/2007 | Alam et al. | |
| 7,354,798 B2 | 4/2008 | Pogge et al. | |
| 7,354,862 B2 | 4/2008 | Wong et al. | |
| 2006/0038274 A1 * | 2/2006 | Ono et al. | 257/686 |
| 2006/0073636 A1 * | 4/2006 | Ravi et al. | 438/109 |
| 2006/0278979 A1 | 12/2006 | Rangel | |
| 2006/0292824 A1 | 12/2006 | Beyne et al. | |
| 2007/0037379 A1 | 2/2007 | Enquist et al. | |
| 2007/0117348 A1 | 5/2007 | Ramanathan et al. | |
| 2007/0296073 A1 * | 12/2007 | Wu et al. | 257/686 |
| 2008/0041517 A1 | 2/2008 | Moriceau et al. | |

OTHER PUBLICATIONS

Mukta G. Farooq et al. U.S. Appl. No. 12/426,466 Entitled "Three Dimensional Intergrated Circuit Intgreation Using Dielectric Bonding First and Through Via Formation Last" filed Apr. 20, 2009.

(Continued)

*Primary Examiner* — Asok K Sarkar
(74) *Attorney, Agent, or Firm* — Ira D. Blecker; Jennifer R. Davis

(57) ABSTRACT

A method of making 3D integrated circuits and a 3D integrated circuit structure. There is a first semiconductor structure joined to a second semiconductor structure. Each semiconductor structure includes a semiconductor wafer, a front end of the line (FEOL) wiring on the semiconductor wafer, a back end of the line (BEOL) wiring on the FEOL wiring, an insulator layer on the BEOL wiring and a metallic layer on the insulator layer. The first semiconductor structure is aligned with the second semiconductor structure such that the metallic layers of each of the semiconductor structures face each other. The metallic layers of each of the semiconductor structures are in contact with and bonded to each other by a metal to metal bond wherein the bonded metallic layers form an electrically isolated layer.

25 Claims, 5 Drawing Sheets

OTHER PUBLICATIONS

L. W. Schaper et al.; "Architecural Implications and Process Development of 3-D VLSI Z-Axis Interconnets Using Through Silicon Vias;"IEEE Transactions on Advanced Packaging, vol. 28, No. 3, Aug. 2005, pp. 356-366.

R. Hon et al.; "Multi-Stack Flip Chip 3D Packaging with Copper Plated Through-Silicon Vertical Interconnection;" IEEE Electronics Packaging Technology Conference, 2005, pp. 384-389.

M. Kawano et al.; "A 3D Packing Technology for 4 Gbit Stacked DRAM with 3 Gbps Data Transfer;" 2006 International Electron Devices Meeting.

Lee Wen Sheng Vincent et al.; "Cu via Exposure by Backgrinding for TSV Applications;" 2007 9th Electronics Packaging Technology Conference; pp. 233-237.

S. Pozder et al.; "Progress of 3D Integration Technologies and 3D Interconnects;" IEEE 2007; pp. 213-215.

S. Denda; "Process Examination of Through Silicon Via Technology;" 2007 IEEE 149 IEEE Polytronic 2007 Conference; pp. 149-152.

* cited by examiner

3D INTEGRATION STRUCTURE AND METHOD USING BONDED METAL PLANES

BACKGROUND OF THE INVENTION

The present invention relates generally to three dimensional (3D) integrated circuits, and more particularly to 3D integrated circuits with through silicon vias and the process by which integrated circuits are bonded together.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits are therefore created to resolve the above-discussed limitations. In a typical formation process of 3D integrated circuits, two wafers, each including an integrated circuit, are formed. The wafers are then bonded with the devices aligned. Deep vias are then formed to interconnect devices on the first and second wafers.

Much higher device density has been achieved using 3D integrated circuit technology. As a result, the total wire length is significantly reduced. The number of vias is also reduced. Accordingly, 3D integrated circuit technology has the potential of being the mainstream technology of the next generation.

Various 3D integrated circuits have been proposed by Enquist et al. U.S. Patent Application Publication 2007/0037379 and Morrow et al. U.S. Pat. No. 7,056,813, the disclosures of which are incorporated by reference herein, disclose forming backside through via connections.

Various solutions have been proposed for joining of the metal layers of integrated circuit devices. Reif et al. U.S. Pat. No. 7,307,003, the disclosure of which is incorporated by reference herein, discloses the joining of multiple semiconductor structures wherein the backside of one structure is joined to the front side of another structure by a metallic layer, at least part of which forms an electrical connection in the joined multiple semiconductor structures. The metallic layer also does not extend entirely across the wafer as there are breaks between the part which forms an electrical connection and the remaining parts of the metallic layer.

Hatano et al. U.S. Pat. No. 6,824,888, the disclosure of which is incorporated by reference herein, discloses metal to metal bonding where one metal is beryllium and the other is copper.

Moriceau et al. U.S. Patent Application Publication 2008/0041517 and Beyne et al. U.S. Patent Application Publication 2006/0292824, the disclosures of which are incorporated by reference herein, disclose the joining of electronic substrates by an intermediate bond layer.

BRIEF SUMMARY OF THE INVENTION

The various advantages and purposes of the present invention as described above and hereafter are achieved by providing, according to a first aspect of the invention, a method of making 3D integrated circuits, comprising the steps of:

obtaining a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;

obtaining a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;

aligning the first semiconductor structure with the second semiconductor structure such that the metallic layers of the first and second semiconductor structures face each other; and contacting and bonding the metallic layers of the first and second semiconductor structures to each other, wherein the bonded metallic layers form an electrically isolated layer.

According to a second aspect of the invention, there is provided a method of making 3D integrated circuits, comprising the steps of:

obtaining a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;

obtaining a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;

aligning the first semiconductor structure with the second semiconductor structure such that the metallic layers of the first and second semiconductor structures face each other;

contacting and bonding the metallic layers of the first and second semiconductor structures to each other, wherein the bonded metallic layers form an electrically isolated layer;

thinning the second semiconductor wafer to a predetermined thickness less than the thickness of the first semiconductor wafer;

forming a via extending through the second semiconductor structure and the bonded metallic layers and stopping on the BEOL layer of the first semiconductor structure; and filling the via with a conductive material, wherein the via is electrically isolated from the bonded metallic layers.

According to a third aspect of the invention, there is provided a 3D integrated circuit structure comprising:

a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;

a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;

the first semiconductor structure aligned with the second semiconductor structure such that the metallic layers of the first and second semiconductor structures face each other; and the metallic layers of the first and second semiconductor structures in contact with and bonded to each other, wherein the bonded metallic layers from an electrically isolated layer.

According to a fourth aspect of the invention, there is provided a 3D integrated circuit structure comprising:

a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;

a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer, wherein the second semiconductor wafer has been thinned to a predetermined thickness less than the thickness of the first semiconductor wafer;

the first semiconductor structure aligned with the second semiconductor structure such that the metallic layers of the first and second semiconductor structures face each other;

the metallic layers of the first and second semiconductor structures in contact with and bonded to each other wherein the bonded metallic layers form an electrically isolated layer;

a via extending through the second semiconductor structure and the bonded metallic layers and stopping on the BEOL layer of the first semiconductor structure; and the via filled with a conductive material, wherein the via is electrically isolated from the bonded metallic layers.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
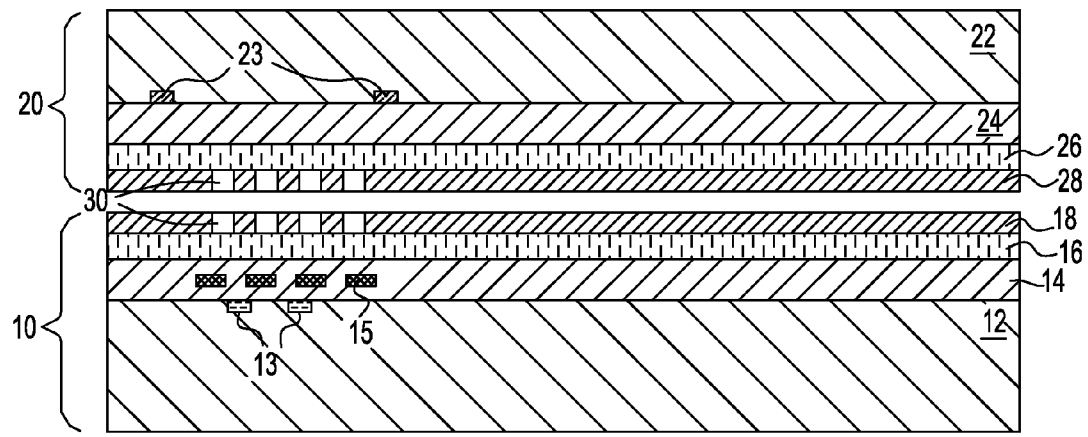
FIGS. 1 to 5 are cross-sectional views illustrating the method steps for forming the 3D integrated circuits according to the present invention.

Referring to the Figures in more detail, and particularly referring to FIG. 1, there is shown a first step in the formation of a 3D integrated circuit structure according to the present invention. First semiconductor structure 10 comprises a semiconductor wafer 12 having integrated circuit devices 13 formed therein. The semiconductor wafer 12 may be made from any semiconductor material including but not limited to group IV semiconductors such as silicon, silicon germanium, or germanium, a III-V compound semiconductor, or a II-VI compound semiconductor.

The semiconductor wafer 12 has a back end of the line (BEOL) wiring 14 thereon. The BEOL wiring 14 typically includes an insulative material, such as an oxide, and various wiring layers which are well known to those skilled in the art but are not shown for clarity. BEOL wiring 14, however, has a plurality of landing pads 15 which provide connections to the various wiring layers in the BEOL wiring 14.

Layered on the BEOL wiring 14 is an insulator layer 16, such as an oxide, followed by a metallic layer 18. The insulator layer 16 separates the metallic layer 18 from the BEOL wiring 14.

The metallic layer is made from a material selected from the group consisting of copper, nickel, copper/nickel, copper/gold and copper/nickel/gold.

Figure 2:
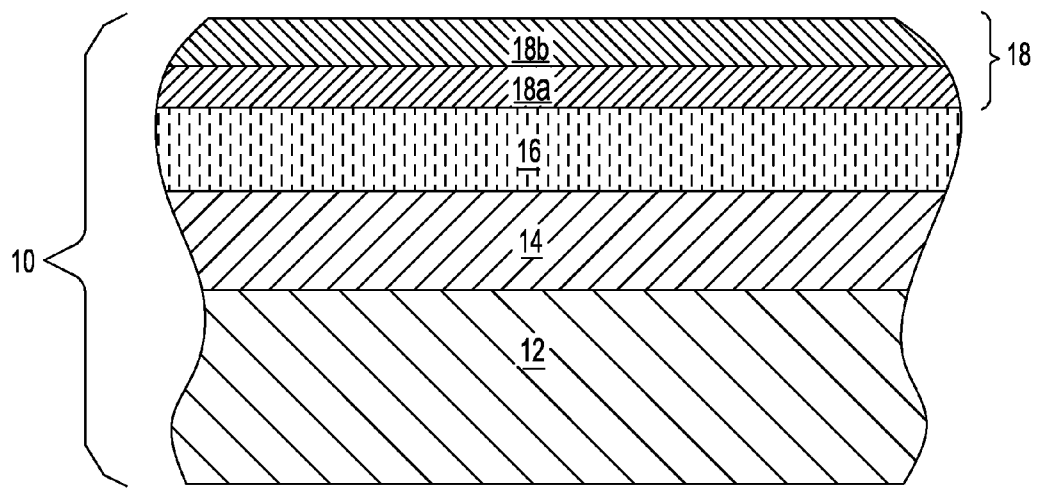

In a preferred embodiment, the metallic layer is actually made up of a plurality of layers. Referring to FIG. 2, there is an enlarged section of first semiconductor structure 10. As can be seen, in this preferred embodiment, metallic layer 18 is actually comprised of several layers. The first layer 18a is an underlayer in contact with the insulator layer 16 and comprises, for example, first tantalum nitride followed by tantalum or first titanium nitride followed by titanium. The second layer 18b is a material selected from the group consisting of copper, nickel, copper/nickel, copper/gold or copper/nickel/gold. In one preferred embodiment, the second layer 18b may be plated on the underlayer 18a of the first semiconductor structure 10. An optional seed layer (not shown) may be deposited prior to plating of second layer 18b.

With respect to the underlayer 18a, it is preferred that the tantalum nitride and tantalum or the titanium nitride and titanium be deposited as separate layers rather than as alloys. Similarly, if copper/nickel, copper/gold or copper/nickel/gold are chosen for the second layer 18b, it is preferred that the copper and nickel (in the first case) or the copper, nickel and gold (in the second case) be deposited as separate layers rather than as alloys. This is particularly important for the second layer 18b which will undergo solid state bonding in a subsequent process step. Generally speaking, pure metals are easier to solid state bond than alloys.

Referring back to FIG. 1, there is also shown a second semiconductor structure 20 comprising a semiconductor wafer 22 having devices 23, BEOL wiring 24, insulator layer 26, preferably an oxide, and metallic layer 28. Second semiconductor structure is substantially similar to first semiconductor structure 10 just discussed above. It should be understood, that while the first and second semiconductor structures 10, 20 are substantially similar in structure, there could be differences in materials of the semiconductor wafers 12, 22, BEOL wirings 14, 24 and insulator layers 16, 26. Metallic layers 18, 28 may be different provided that they may be bonded together (to be discussed hereafter) to form a strong metallic bond. Additionally, the first and second semiconductor structures 10, 20 may have different functionalities.

It should be understood that only a portion of the semiconductor wafers 12, 22 and first and second semiconductor structures 10, 20 are actually shown in FIG. 1 and that what is shown in FIG. 1 represents only a portion of one chip site.

Still referring to FIG. 1, in one preferred embodiment, metallic layers 18, 28 have perforations 30. The purpose of these perforations 30 will be discussed hereafter. The perforations 30 can be made after the metallic layers 18, 28 have been formed on the insulator layers 16, 26 or later on in the process to be discussed hereafter. In a preferred embodiment, the perforations 30 are made when the metallic layers 18, 28 are formed on the insulator layers 16, 26. The perforations 30, when made in a preferred embodiment as just discussed, are made by a subtractive etching process.

Figure 3:
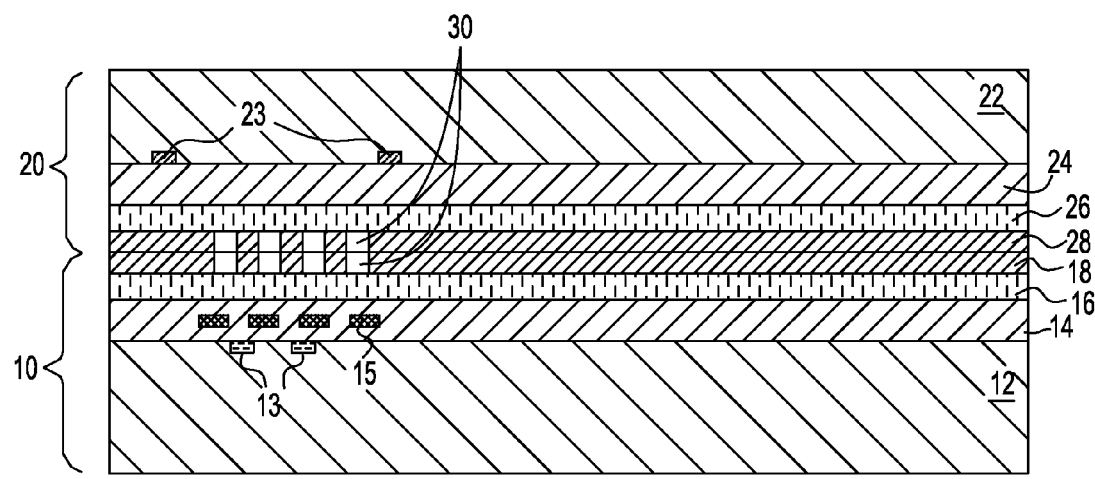

Referring now to FIG. 3, the first and second semiconductor structures 10, 20 are aligned, contacted and then bonded. In one preferred embodiment, the bonding is made by a solid state bonding process to form a metal to metal bond. The solid state bonding process in general may be accomplished by the following steps. First, the surface of the metallic layers is cleaned or treated so that a pristine surface is presented for joining. Then, the first and second semiconductor structures 10, 20 are aligned with the respective metallic layers 18, 28 facing each other. If perforations 30 have been made in the metallic layers 18, 28, then the first and second semiconductor structures 10, 20 should also be aligned such that the perforations 30 are in alignment. The assembly may be preheated to about 150-250° C. in a suitable ambient such as forming gas, nitrogen or a partial vacuum either before aligning, or after aligning but before contacting the wafers. Lastly, the metallic layers 18, 28 are contacted and pressure of 30 to 50 Kilo Newtons is applied for 30-60 minutes while at a temperature of about 300-400° C. in a suitable ambient such as forming gas, nitrogen or a partial vacuum to complete the solid state bonding process.

Figure 9:
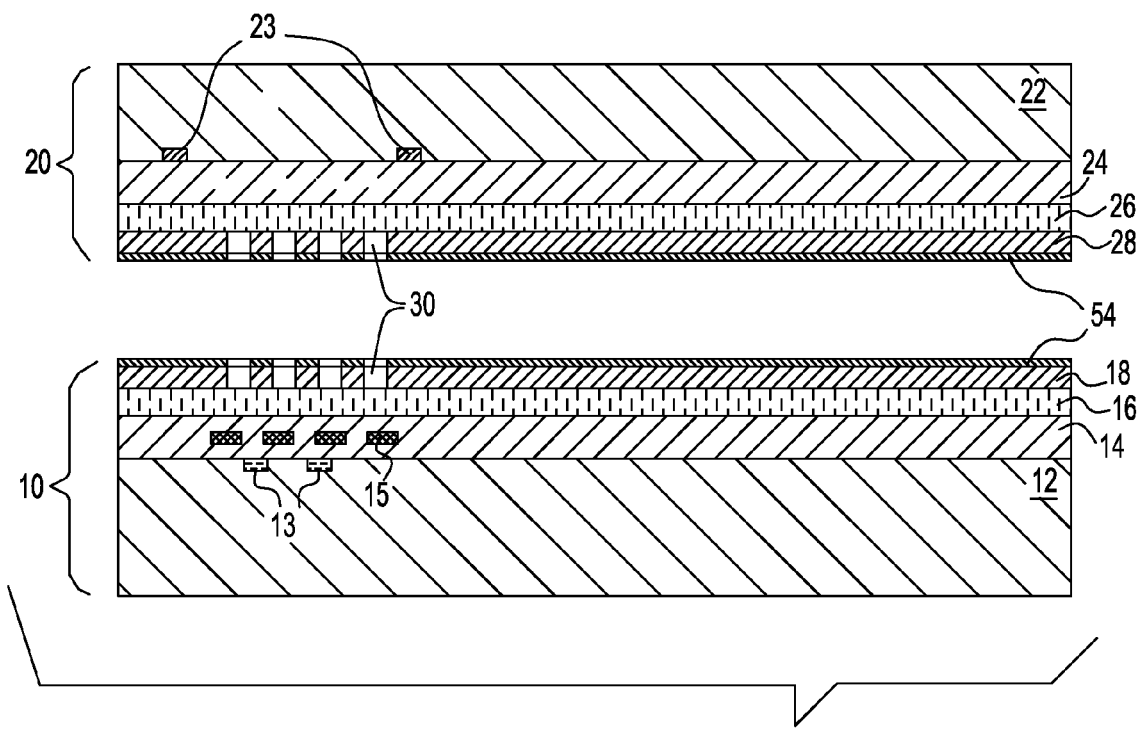
FIG. 9 illustrates an alternative methodology for forming the 3D integrated circuits according to the present invention.

In another preferred embodiment, the metallic layers 18, 28 could be joined to each other with solder. Referring to FIG. 9, semiconductor structures 10, 20 are shown similarly to FIG. 1, except that one or both of the semiconductor structures 10, 20 contain a layer of solder 54. In FIG. 9, both of the semiconductor structures 10, 20 have a layer of solder 54 in one preferred embodiment but in another preferred embodiment, only one of the semiconductor structures 10, 20 may have the layer of solder 54. Solder layer 54 may be dispensed by plating (most preferred), evaporating, sputtering or even in paste form. Use of the solder layer 54 has the advantage of achieving the bonding at a lower temperature such as 183-300° C. (depending on whether eutectic tin/lead, other tin/lead or lead-free alloys are used), whereas copper or gold solid state bonds are typically at temperatures greater than 350° C., and even approaching 400° C. In addition, no pressure is required in solder bonding.

Figure 8:
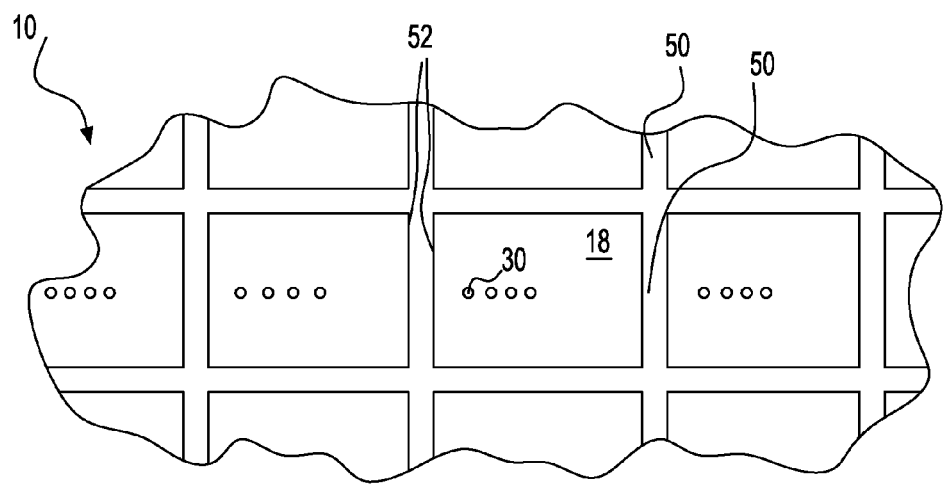
FIG. 8 is a plan view of a first semiconductor structure.

It should be understood that metallic layers 18, 28 extend across the entire semiconductor wafer 12, 22 and forms a solid layer across the entire wafer except where perforations 30 may penetrate the metallic layer 18, 28. Most preferably, the metallic layers 18, 28 extend across the entire semiconductor wafer 12, 22 except where perforations 30 may penetrate the metallic layers 18, 28 and except in the kerf area between chip sites. Referring to FIG. 8, where a section of semiconductor structure 10 is shown, it can be seen that metallic layer 18 covers each chip site 52. However, the metallic layer 18 does not extend into the kerf area 50 between chip sites. The reason for this last limitation is that if metallic layer 18 extends into the kerf areas 50, the dicing of the individual chips at chip sites 52 becomes more difficult and any cutting of the metallic layer 18 in the kerf area 50 could cause contamination of the wafer and individual chips. Accordingly, the metallic layer 18 is preferably avoided in the kerf area 50. In a similar manner, metallic layer 28 covers each chip site in semiconductor structure 20. It can be seen that most importantly, in either case, there will be complete metal to metal bond between individual chips, except where there are perforations.

After bonding, the joined metallic layers 18, 28 forms a layer that is electrically isolated from the remainder of the first and second semiconductor structures 10, 20. In essence, the joined metallic layers 18, 28 forms an electrically floating plane. While the joined metallic layers 18, 28 do not form a part of the circuitry of the first and second semiconductor structures 10, 20, it may be desirable to make the joined metallic layers 18, 28 a ground plane as it is not necessary to electrically connect a ground plane to the circuitry of the first and second semiconductor structures 10, 20. The joined metallic layers 18, 28 extend across the entire expanse of the joined wafers, except for where the perforations penetrate the joined metallic layers.

Figure 4:
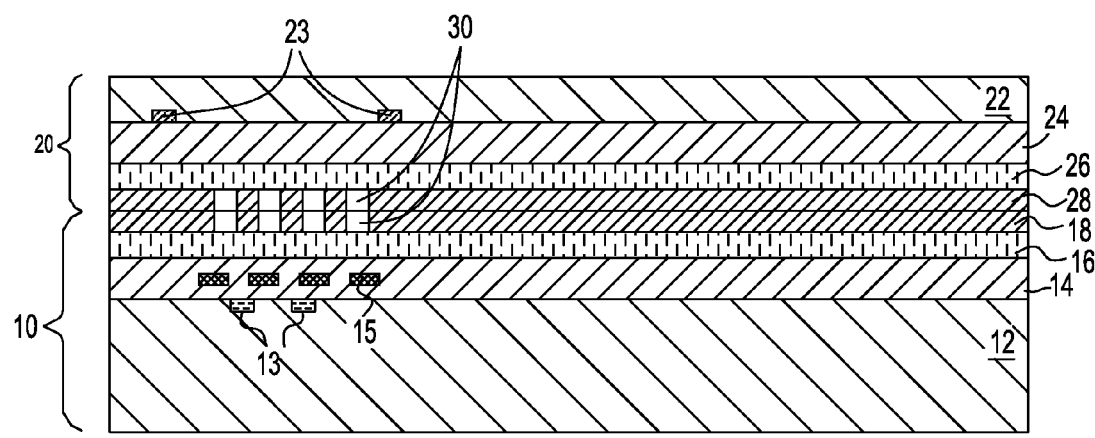

The second semiconductor wafer 22 of the second semiconductor structure 10 is then thinned to a predetermined thickness less than the thickness of the first semiconductor wafer 12 of the first semiconductor structure 10 as shown in FIG. 4. The thinning may be by a combination of grinding, polishing and etching.

Figure 5:
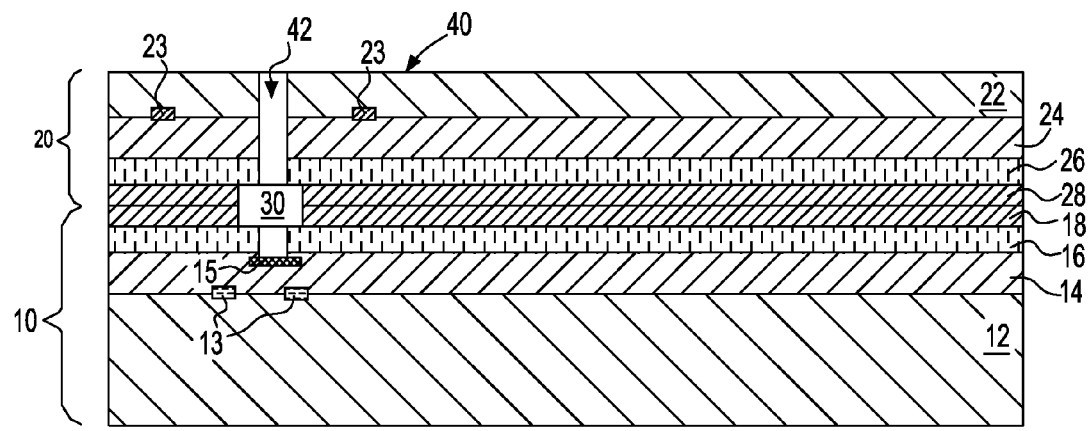

Referring now to FIG. 5, a through silicon via (TSV) 42 is formed by a lithographic and etching process. The TSV 42 extends from the backside 40 of the second semiconductor wafer, through the second semiconductor structure and finally stopping on landing pad 15 in BEOL wiring 14 of the first semiconductor structure 10. The etching of TSV 42 may be done by a conventional reactive ion etching (RIE) process or a process such as the Bosch process wherein steps of RIE and redeposition are repeated to give a nearly vertical side wall. In this FIG. 5, one of the perforations 30 has been enlarged, and only one landing pad 15 is shown, for clarity. If the metallic layers 18, 28 have not had their perforations 30 made as indicated in FIG. 1, the perforations 30 will be made when TSV 42 is formed. If perforations 30 are made when TSV 42 is formed, there will need to be a clean or etch step to remove any metal that has been redeposited on the walls of the TSV 42. It is noted that TSV 42 has a smaller diameter than the diameter of perforations 30 to allow for tolerances. As tolerances get smaller, the diameter of perforations 30 would approach that of TSV 42. TSV 42 is subsequently filled with an electrically non-conducting layer commonly referred to as the insulation or passivation, followed by other layers which act as diffusion barriers and adhesion layers, followed by metallic material. It should be understood that the metallic material that fills TSV 42 should not make electrical contact with the joined metallic layers 18, 28. This result can be accomplished in two ways. One way is to have TSV 42 slightly smaller than perforations 30, as shown in FIG. 6, and a second way is to have TSV 42 lined with an electrically insulating material, as shown in FIG. 7 and as described above.

Figure 6:
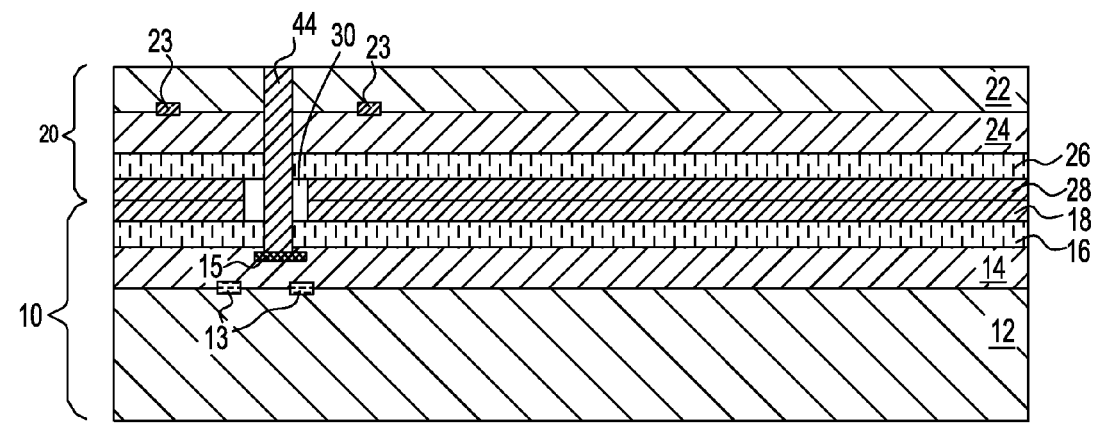
FIG. 6 is a cross-sectional view of a first preferred embodiment of a 3D integrated circuit structure according to the present invention.
Figure 7:
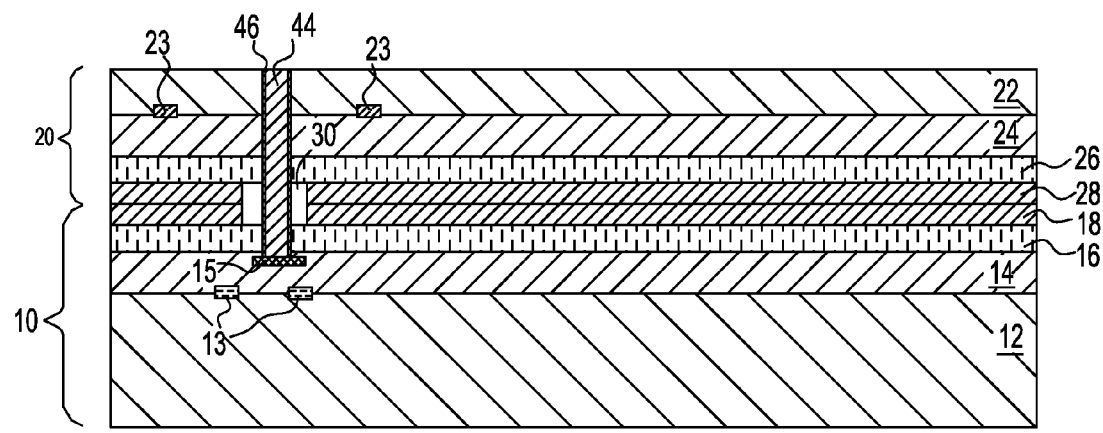
FIG. 7 is a cross-sectional view of a second preferred embodiment of a 3D integrated circuit structure according to the present invention.

FIG. 6 illustrates one preferred embodiment of a 3D integrated circuit structure and FIG. 7 illustrates a second preferred embodiment of a 3D integrated circuit structure.

Referring now to FIG. 6, in a preferred embodiment, TSV 42 has been filled with a metallic material 44, preferably copper. Perforation 30 has been enlarged for clarity.

In another preferred embodiment, as shown in FIG. 7, the TSV 42 is lined with an insulator material 46, such as an oxide, prior to deposition of the metallic material 44, preferably copper, to fill TSV 42. Perforation 30 has been enlarged for clarity.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of making 3D integrated circuits, comprising the steps of:
   obtaining a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;
   obtaining a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;
   aligning the first semiconductor structure with the second semiconductor structure such that the metallic layers of the first and second semiconductor structures face each other; and
   contacting and bonding the metallic layers of the first and second semiconductor structures to each other, wherein the bonded metallic layers form an electrically isolated layer.

2. The method of claim 1 wherein the metallic layers of the first and second semiconductor structures have perforations and the perforations of the metallic layers are in alignment with each other.

3. The method of claim 1 wherein the metallic layers are made of a material selected from the group consisting of copper, nickel, copper/nickel, copper/gold and copper/nickel/gold.

4. The method of claim 1 wherein the metallic layers comprise an underlayer in contact with the insulator layer, the underlayer selected from the group consisting of tantalum nitride/tantalum and titanium nitride/titanium, and a material selected from the group consisting of copper, nickel, copper/nickel, copper/gold and copper/nickel/gold wherein the material of each metallic layer are bonded together.

5. The method of claim 1 wherein the bonding of the metallic layers is by a metal to metal solid state bonding process.

6. The method of claim 1 wherein the bonding of the metallic layers is by use of a solder process wherein the bonding interface undergoes melting and re-solidification.

7. A method of making 3D integrated circuits, comprising the steps of:
   obtaining a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;
   obtaining a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;
   aligning the first semiconductor structure with the second semiconductor structure such that the metallic layers of the first and second semiconductor structures face each other;
   contacting and bonding the metallic layers of the first and second semiconductor structures to each other, wherein the bonded metallic layers form an electrically isolated layer;
   thinning the second semiconductor wafer to a predetermined thickness less than the thickness of the first semiconductor wafer;
   forming a via extending through the second semiconductor structure and the bonded metallic layers and stopping on the BEOL layer of the first semiconductor structure; and
   filling the via with a conductive material wherein the via is electrically isolated from the bonded metallic layers.

8. The method of claim 7 wherein the metallic layers of the first and second semiconductor structures have perforations and the perforations of the metallic layers are in alignment with each other.

9. The method of claim 7 wherein the metallic layers of the first and second semiconductor structures have perforations and the perforations of the metallic layers are in alignment with each other and wherein forming a via comprises etching only into the second semiconductor wafer, FEOL wiring, BEOL wiring and insulator of the second semiconductor structure and etching only into the insulator layer and BEOL wiring of the first semiconductor structure.

10. The method of claim 7 wherein in the step of obtaining a first semiconductor structure further comprises forming perforations in the metallic layer, wherein in the step of obtaining a second semiconductor structure further comprises forming perforation in the metallic layer and wherein in the step of aligning includes aligning the perforations of the metallic layers.

11. The method of claim 7 further comprising the step between forming a via and filling the via of lining the via with an insulating material.

12. The method of claim 7 wherein the metallic layers are made of a material selected from the group consisting of copper, nickel, copper/nickel, copper/gold and copper/nickel/gold.

13. The method of claim 7 wherein the bonding of the metallic layers is by a metal to metal solid state bonding process.

14. The method of claim 7 wherein the bonding of the metallic layers is by use of a solder process wherein the bonding interface undergoes melting and re-solidification.

15. The method of claim 7 wherein the metallic layers comprise an underlayer in contact with the insulator layer, the underlayer selected from the group consisting of tantalum nitride/tantalum and titanium nitride/titanium, and a material selected from the group consisting of copper, nickel, copper/nickel, copper/gold and copper/nickel/gold wherein the material of each metallic layer are bonded together.

16. A 3D integrated circuit structure comprising:
   a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;
   a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer;
   the first semiconductor structure aligned with the second semiconductor structure such that the metallic layers of the first and second semiconductor structures face each other; and the metallic layers of the first and second semiconductor structures in contact with and bonded to each other wherein the bonded metallic layers form an electrically isolated layer.

17. The structure of claim 16 wherein the metallic layers of the first and second semiconductor structures have perforations and the perforations of the metallic layers are in alignment with each other.

18. The structure of claim 16 wherein the metallic layers are made of a material selected from the group consisting of copper, nickel, copper/nickel, copper/gold and copper/nickel/gold.

19. The structure of claim 16 wherein the metallic layers comprise an underlayer in contact with the insulator layer, the underlayer selected from the group consisting of tantalum nitride/tantalum and titanium nitride/titanium, and a material selected from the group consisting of copper, nickel, copper/nickel, copper/gold and copper/nickel/gold wherein the material of each metallic layer are bonded together.

20. The structure of claim 16 wherein at least one of the metallic layers includes a layer of solder material.

21. A 3D integrated circuit structure comprising:
a first semiconductor structure comprising a first semiconductor wafer, a front end of the line (FEOL) wiring on the first semiconductor wafer, a back end of the line (BEOL) wiring on the FEOL wiring, an insulator layer on the BEOL wiring and a metallic layer on the insulator layer;
a second semiconductor structure comprising a second semiconductor wafer, a front end of the line (FEOL) wiring on the second semiconductor wafer, a back end of the line (BEOL) wiring on the FEOL wiring, an insulator layer on the BEOL wiring and a metallic layer on the insulator layer, wherein the second semiconductor wafer has been thinned to a predetermined thickness less than the thickness of the first semiconductor wafer;
the first semiconductor structure aligned with the second semiconductor structure such that the metallic layers of the first and second semiconductor structures face each other;
the metallic layers of the first and second semiconductor structures in contact with and bonded to each other wherein the bonded metallic layers form an electrically isolated layer;
a via extending through the second semiconductor structure and the bonded metallic layers and stopping on the BEOL layer of the first semiconductor structure; and
the via filled with a conductive material wherein the via is electrically isolated from the bonded metallic layers.

22. The structure of claim 21 wherein the metallic layers of the first and second semiconductor structures have perforations and the perforations of the metallic layers are in alignment with each other.

23. The structure of claim 21 wherein the via has a lining of an insulating material between the conductive material and a wall of the via.

24. The structure of claim 21 wherein the metallic layers are made of a material selected from the group consisting of copper, nickel, copper/nickel, copper/gold and copper/nickel/gold.

25. The structure of claim 21 wherein the metallic layers comprise an underlayer in contact with the insulator layer, the underlayer selected from the group consisting of tantalum nitride/tantalum and titanium nitride/titanium, and a material selected from the group consisting of copper, nickel, copper/nickel, copper/gold and copper/nickel/gold wherein the material of each metallic layer are bonded together by a metal to metal bond.

* * * * *